United States Patent [19]

Dobkin

[11] 4,004,462
[45] Jan. 25, 1977

[54] TEMPERATURE TRANSDUCER

[75] Inventor: Robert C. Dobkin, Atherton, Calif.

[73] Assignee: National Semiconductor Corporation, Santa Clara, Calif.

[22] Filed: June 7, 1974

[21] Appl. No.: 477,323

[52] U.S. Cl. .............................. 73/362 R; 307/310
[51] Int. Cl.² .......................................... G01J 5/00
[58] Field of Search .... 73/362 SC, 362 AR, 362 R; 307/310

[56] References Cited

UNITED STATES PATENTS

| | | | |
|---|---|---|---|
| 3,181,364 | 5/1965 | Barton | 73/342 |
| 3,271,660 | 9/1966 | Hilbiber | 307/310 X |
| 3,383,920 | 5/1968 | Greenly | 73/362 SC |
| 3,421,375 | 1/1969 | Dimon | 73/362 SC |
| 3,503,261 | 3/1970 | Riester et al. | 73/362 AR |
| 3,688,581 | 9/1972 | LeQuemec | 73/362 AR |
| 3,809,929 | 5/1974 | Vittoz | 307/310 |
| 3,851,241 | 11/1974 | Wheatley | 73/362 SC X |
| 3,882,728 | 5/1975 | Wittlinger | 73/362 SC |

*Primary Examiner*—Jerry W. Myracle
*Attorney, Agent, or Firm*—Willis E. Higgins; Gail W. Woodward

[57] ABSTRACT

A temperature transducer includes a temperature sensor, a voltage regulator connected in parallel with the sensor, and a differential amplifier having one input thereof connected to the output of the sensor. An output of the differential amplifier is connected through an amplifier to an output terminal and a second input to the operational amplifier is disposed for connection to an external circuit or to the output terminal of the transducer. The temperature sensor includes a current inverter connected to a pair of transistors to maintain the ratio of their current densities constant with changes in temperature. The difference of the base-emitter voltages of the transistors operating at different current densities is directly proportional to temperature in degrees Kelvin. This difference of the base-emitter voltages is developed across an output resistor which is connected to an appropriate input of the differential amplifier.

23 Claims, 4 Drawing Figures

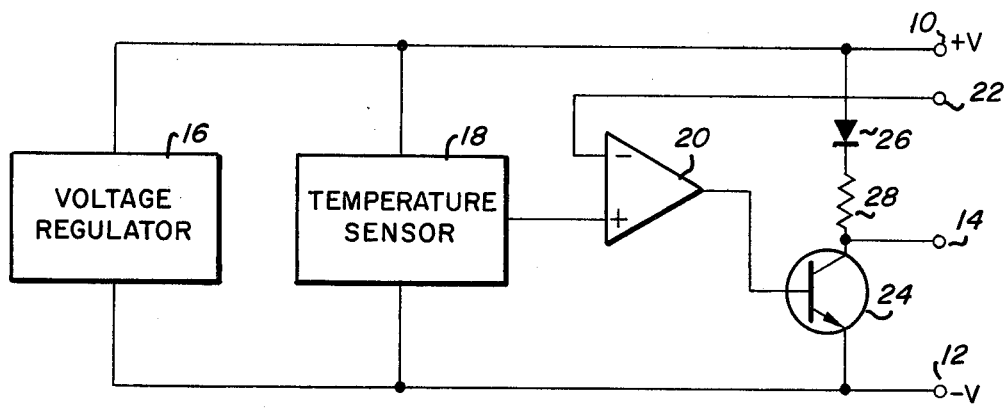
Fig_1
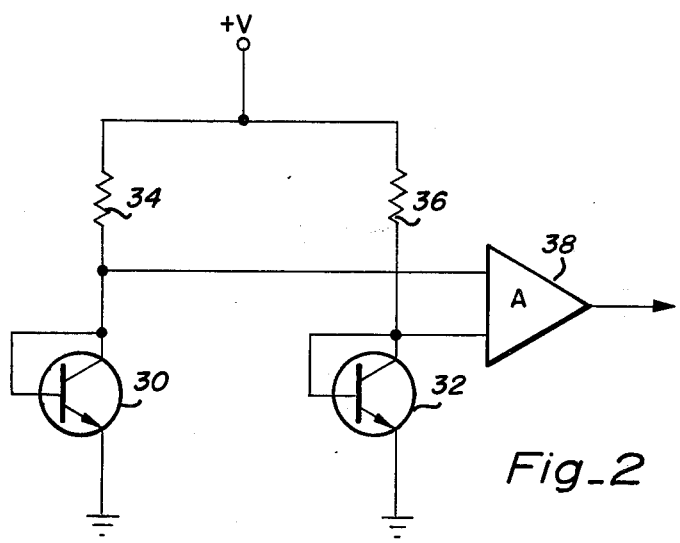
Fig_2
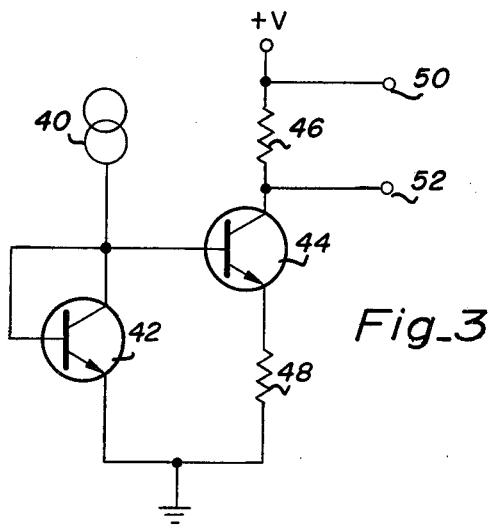
Fig_3

TEMPERATURE TRANSDUCER

BACKGROUND OF THE INVENTION

1. Field of the Invention

This invention relates generally to a temperature transducer, and more particularly to a temperature measurement and control system which provides an output which is directly proportional to temperature in the degrees Kelvin.

2. Prior Art

Electrical temperature sensors which are presently available either cannot be or are difficult of being incorporated into a monolithic circuit with appropriate supply and output circuits to form a unitary temperature transducer. The need for such a transducer can be readily appreciated when compared with existing temperature measurement and control systems. Such a transducer does not require wiring to remote locations for being supplied with regulated voltage or for amplifying, scaling, and performing other operations on its output before such an output can be utilized for measurement or control. Furthermore, power dissipation within such a transducer will be considerably lower than that encountered in comparable temperature transducers employing presently available temperature sensors.

The majority of the presently available temperature sensors cannot be easily implemented in measurement and control systems. Thermocouples have relatively low output signals which are difficult to amplify with stability. Furthermore, thermocouples require cold junction compensation. Resistance and thermistor sensors are nonlinear and excitation dependent. The major disadvantage of such sensors, however, is that their outputs are not directly related to any temperature scale.

SUMMARY OF THE INVENTION

A primary object of the present invention is to provide a monolithic temperature transducer.

Another object of the present invention is to provide a temperature transducer having an output which varies in direct proportion to temperature change.

A further object of the present invention is to provide a temperature transducer having an output which directly related to a known temperature scale.

Still another object of the present invention is to provide a temperature transducer having a relatively low power dissipation.

Another object of the present invention is to provide a temperature transducer which develops a relatively high output signal.

These and other objects of the present invention are attained by a monolithic circuit containing a temperature sensor which employs the temperature sensitivity of the difference in emitterbase voltages between transistors operating at different current densities to provide an indication of temperature. A feature of the present invention resides in the provision of an active shunt regulator connected across the supply voltage to regulate the operating voltage and to provide a reference which is externally available at the power supply terminals of the monolithic circuit. A further feature of the present invention resides in the provision of a differential amplifier which is employed to make the output of the temperature sensor externally available at a terminal of the monolithic circuit as well as to provide gain or level shifting thereof, if desired.

The present invention has the distinct advantage of providing an output which can be directly calibrated in a known temperature scale.

BRIEF DESCRIPTION OF THE DRAWINGS

FIG. 1 is a partial block and partial schematic diagram of a temperature transducer constructed in accordance with the principles of the present invention;

FIGS. 2 and 3 are schematic diagrams of circuits which are useful in explaining the principles of the present invention.

DESCRIPTION OF THE PREFERRED EMBODIMENT

Figure 4:
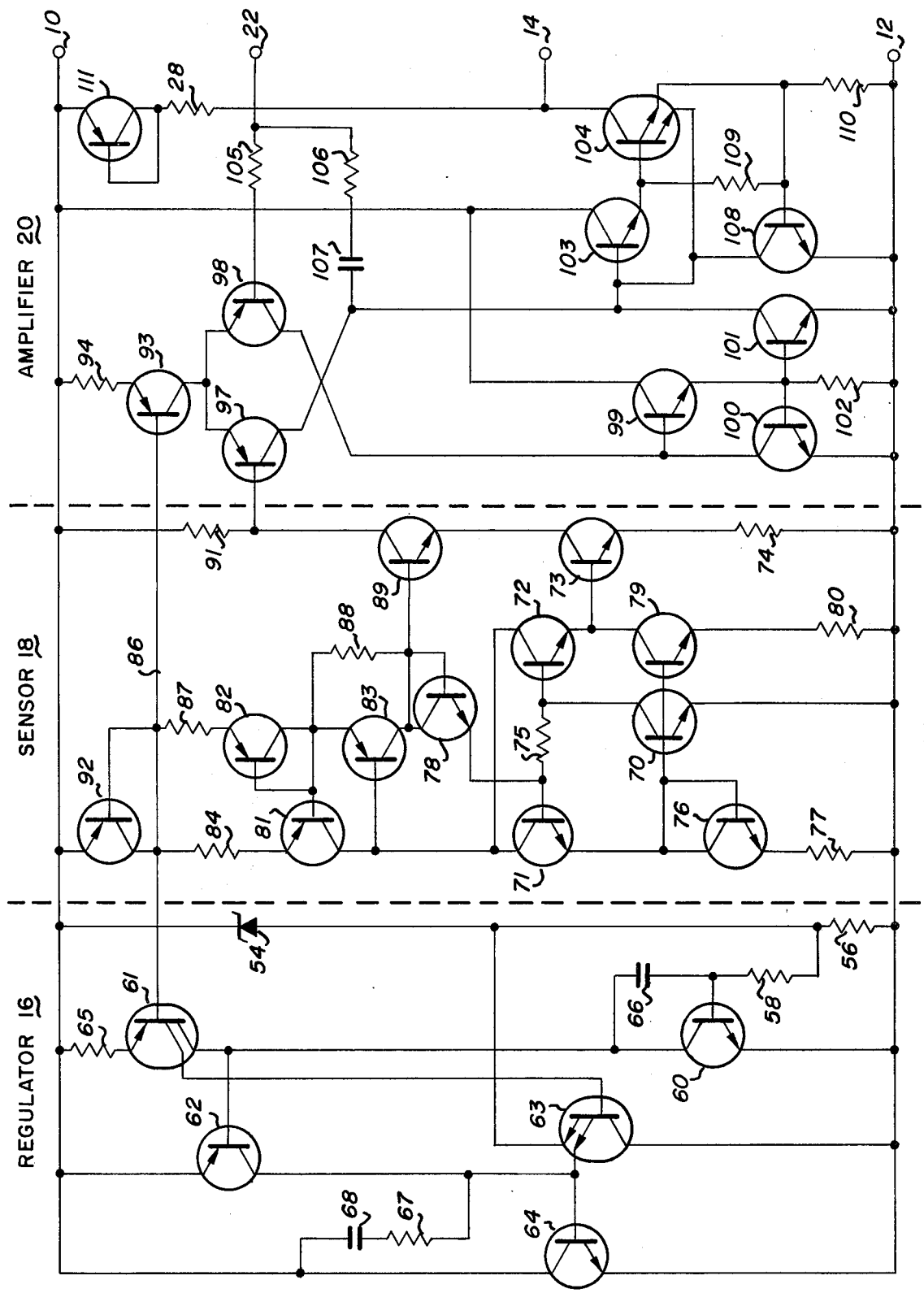
FIG. 4 is a schematic diagram of the circuit illustrated in FIG. 1.

With reference to FIG. 1, there is shown a temperature transducer constructed in accordance with the principles of the present invention and having a pair of terminals 10 and 12 connected to the positive and negative terminals, respectively, of a power supply (not shown). An output which varies in proportion to changes in temperature is provided on a terminal 14. A shunt voltage regulator 16 is connected in parallel with the supply voltage to regulate the operating voltage and provide a reference voltage which is externally available on terminals 10 and 12. A temperature sensor 18 is connected in parallel with the voltage regulator 16. An output of the temperature sensor 18 is supplied to one input of a differential amplifier 20 having the other input connected to a terminal 22. An output of the differential amplifier is connected to the base of a transistor 24 having its emitter connected to the terminal 12 and its collector connected to the terminal 14. The positive supply voltage on the terminal 10 is connected through a diode 26 and a resistor 28 to the collector of the transistor 24.

If the temperature sensor illustrated in FIG. 1 can provide an output which changes in direct proportion to changes in temperature and which can be directly calibrated in a known temperature scale, the transistor can be employed as either a proportional controller or as an on-off controller. For example, if the terminal 14 is connected to the terminal 22, the differential amplifier 20 and the output circuit including the transistor 24 form an operational amplifier. Accordingly, an output derived between the terminals 10 and 14 will be directly proportional to temperature. Such a circuit forms a thermometer or proportional temperature controller. If, however, a reference voltage is supplied to the terminal 22, an output will be provided on the terminal 14 whenever the output of the temperature sensor 18 is less than that reference voltage. Such a circuit forms an on-off temperature controller.

As previously mentioned, the presently known temperature sensors do not provide an output which is directly related to a known temperature scale. Almost all circuit elements in a monolithic integrated circuit are temperature sensitive. Probably the most widely used temperature sensitive parameter is the emitter-base voltage of an NPN transistor. For a discussion of this phenomenon, see Brugler, J. S., "Silicon Transistor Biasing For Linear Collector Current Temperature Dependence", IEEE Journal of Solid State Circuits, Page 57–58; June, 1957. However, this temperature sensitive characteristic of the emitter-base voltage of an NPN transistor is inconvenient for use as a calibrated sensor. The value of the emitter-base voltage varies with processing parameters and may vary as much as ± 100 mV over a production range. Also, the emitter-base voltage is not directly proportional to any temperature scale, since the transistor has a negative coefficient of temperature causing the emitter-base voltage to decrease as the temperature increases. It has been found that a more practical and useful parameter is the difference in the emitter-base voltages of transistors operating at different current densities.

As shown in FIG. 2, a pair of transistors 30 and 32 are connected in series with resistors 34 and 36, respectively, between a souce of voltage and ground potential. The collector of each transistor 30, 32 is connected to its base and to a respective input of a differential amplifier 38.

If the transistors 30 and 32 are matched and have the same emitter area and if the resistors 34 and 36 are equal in value, no output will be provided from the differential amplifier 38, even with temperature changes. However, if the current density in one of the transistors 30, 32 is different than the current density in the other transistor, and the ratio of the collector current of one transistor to the collector current of the other transistor remains constant with the changes in temperature, an output will be provided from the differential amplifier 38 which will be directly proportional to temperature in degrees Kelvin. A different current density can be generated by either making the collector currents of the two transistors different, by making the collector currents equal and the emitter areas of the two transistors different, or by a combination of these two techniques. Each of the transistors 30 and 32 has a negative temperature coefficient. If the two transistors are operated at the different current densities, the temperature coefficient of the two transistors will be different. The differential amplifier 38 provides an output corresponding to the difference between these two temperature coefficients. More particularly, the differential amplifier 38 provides an output corresponding to the difference between the emitter-base voltage of the transistors 30 and 32. This difference is equal to $$\Delta V_{be} = \frac{kT}{q} \ln \frac{I_{c_1}}{I_{c_2}} \qquad (1)$$

where $K$ Boltzmann's constant, $T$ is absolute temperature in degrees Kelvin, $q$ is the charge on an electron, and $I_{c1}$ and $I_{c2}$ are the collector currents or emitter current densities of the transistors 30 and 32, respectively.

It can be appreciated that the circuit illustrated in FIG. 2 is intended only to represent the principle of the present invention, since it cannot be easily implemented. For example, the inputs to the amplifier 38 are floating and cannot be easily controlled with respect to a reference. Furthermore, the circuit illustrated in FIG. 2 cannot be easily or readily constructed as an integrated circuit to provide precise or accurate gain, since any feedback which may be incorporated therein would tend to alter the collector currents of the transistors 30 and 32. From the above equation (1) it can be appreciated that such a change or affect on the collector currents would destroy the temperature sensing capability of the circuit.

The circuit illustrated in FIG. 3 also demonstrates this basic principle. As shown therein, a current source 40 is connected through a transistor 42 to ground potential, and is also connected to the base of the transistor 42 and to the base of a transistor 44. The collector of the transistor 44 is connected through a resistor 46 to a source of voltage and the emitter thereof is connected through a resistor 48 to ground potential. An output is provided across the resistor 46 on terminals 50 and 52.

If the transistors 42 and 44 are matched and operated at different current densities, the difference in their emitter-base voltages will appear across the resistor 48. This difference is expressed by equation (1) above, where $I_{c1}$ and $I_{c2}$ are the collector currents or current densities of the transistors 42 and 44, respectively.

Since, $$\Delta V_{be} = V_{be_1} - V_{be_2} = i_{c_2} R_{48} \qquad (2)$$

where $i_{c2}$ is the collector current of transistor 44, then $$i_{c_2} = \frac{kT}{qR_{48}} \ln \frac{I_{c_1}}{I_{c_2}} \qquad (3)$$

From these equations, it can be seen that the collector current of transistor, 44, $i_{c_2}$, is proportional to absolute temperature and linear if the ratio of the current densities of the transistors 42 and 44 remain constant and is other than unity. Appropriate scaling of the resistor 46 allows the output across the terminals 50 and 52 to be scaled directly in degrees Kelvin.

Unfortunately, the ratio of the collector currents or current densities in the circuit illustrated in FIG. 3 does not remain constant with the changes in temperature, since the collector current of the transistor 42 is fixed by the current source 40. If the ratio of the current densities of the transistors 42 and 44 does not remain constant with the changes in temperature, an output derived across the terminals 50, 52 will not be directly proportional to temperature. Although the base-emitter voltages of the transistors 42 and 44 will change with the changes in temperature, it can be appreciated from expression (3) that the current through the resistor 46 and, therefore, the voltage across the terminals 50, 52 will not be directly proportional to temperature. If, however, the current supplied by the current source 40 can be made to vary in direct proportion to changes in temperature, then it can be appreciated from expression (3) that the output derived across the terminals 50, 52 will also be directly proportional to temperature.

The temperature sensor 18 illustrated in FIG. 4 overcomes the above mentioned difficulties. A relatively stable and regulated voltage supply is provided by the voltage regulator 16 illustrated in FIG. 4. Zener diode 54 connected in series with resistor 56 between the voltage supply terminals 10 and 12 breaks down at a predetermined voltage, such as 6.2 volts. Without additional circuitry, when the Zener diode 54 breaks down, the voltage impressed on the sensor 18 will be that which can be supported by the diode 54 and will be dependent upon the Zener diode current. In order to reduce the dependence upon the voltage which is supportable by the Zener diode 54, the anode of the Zener diode 54 is connected through a resistor 58 to the base of a transistor 60 having its emitter connected to the terminal 12. When the voltage across the terminals 10 and 12 exceeds the breakdown voltage of the Zener diode 54 and the base-emitter voltage of the transistor 60, current flows into the base of the transistor 60 resulting in current flow therethrough which is equal to the product of such base current and the beta of the transistor. Accordingly, if the voltage on the terminals 10 and 12 increases, the current through the regulator 16 will increase by an amount considerably more than would be achieved without the transistor 60. The increase in current resulting from the action of the transistor 60 lowers the dynamic impedance of the regulators 16, thereby maintaining a more regulated and stable voltage across its terminals.

The collector of the transistor 60 is connected to one collector of a transistor 61 and to the base of a transistor 62. Accordingly, the collector current of the transistor 62 is regulated by the collector current of the transistor 60. As a result thereof, the current flow through the regulator 16 will, as a minimum, be equal to the product of the base current of the transistor 60, the beta of the transistor 60, and the beta of the transistor 62. The collector of the transistor 62 is connected to one emitter of a transistor 63 and to the base of a transistor 64. Accordingly, the base current of the transistor 64 is supplied from the transistor 62. Since the collector current of the transistor 64 is equal to its base current times its beta, the total current flow through the regulator 16 will, as a minimum, be equal to the base current of the transistor 60 multiplied by the product of the betas of the transistors 60, 62 and 64. Assuming, for example, a one milliamp increase in current through the regulator 16, and a beta of 100 for each of transistors 60, 62 and 64, a one nanoamp increase in current through the Zener diode 54 will occur with the remaining current being divided between the transistors 60, 62 and 64. Such a one nanoamp increase in current through the Zener diode 54, as compared to a one milliamp increase, represents a relatively small increase in the voltage across the terminals 10 and 12.

The emitter of the transistor 61 is connected through a resistor 65 to the terminal 10 and its second collector is connected to the base of the transistor 63. The transistor 63 is operated in its inverted mode, as illustrated in the drawing, with its collector connected to the terminal 12 and its second emitter connected to the anode of the Zener diode 54. The transistor 63 establishes a minimum collector current for the transistor 62 and a minimum current flow through the Zener diode 54 so that these devices are operating within their normal range, thereby eliminating the effects of leakage current and similar problems encountered under low current conditions. The transistor 61 establishes a minimum collector current for the transistor 60 and drives the transistor 63.

In the above example in which the regulator 16 is drawing one milliamp of current, the Zener diode 54 is drawing only one nanoamp which is insufficient to operate the Zener diode without encountering adverse effects. Accordingly, the transistor 63 and resistor 56 in combination provide a current flow through the Zener diode 54 of approximately twenty microamps. The transistor 63 provides a collector current in the transistor 62 of approximately 10 microamps and the transistor 61 provides a collector current in the transistor 60 in the range ten to twenty microamps. Accordingly, the transistors 61 and 63 act as current sources to set the operating currents of the Zener diode 54 and the transistors 60 and 62 well above their leakage currents. The transistor 64, of course, has a collector current which is only slightly less than the current through the regulator 16. The current sources for establishing the minimum operating currents do not effect the gain of the regulator 16, since it is the change in current, rather than its magnitude, which determines the amount of change in the voltage across the terminals 10 and 12.

A junction capacitor 66 is connected in parallel with the collector-base junction of the transistor 60 and a series connected resistor 67 and junction capacitor 68 are connected in parallel with the collector-base junction of the transistor 64. These components provide frequency compensation for the circuit, since it is operated at a relatively high gain and is susceptible to oscillation without such compensation.

Temperature sensing by the sensor 18 is achieved by impressing the difference of the emitter-base voltages of transistors 70, 71, 72 and 73 operating at different current densities across a resistor 74. Disregarding for the moment the effect of a resistor 75 and considering it to be shorted, the voltage impressed on the resistor 74 will be equal to the sum of the emitter-base voltages of the transistors 70 and 71 minus the sum of the emitter-base voltages of the transistors 72 and 73. As previously mentioned, and as shown by equation (1) above, the ratio of the current densities of the transistors 70 and 71 to the current densities of the transistor 72 and 73 must remain constant with changes in temperature if the voltage impressed on the resistor 74 is to be directly proportional to temperature. If the collector currents of the transistors 70, 71 72 and 73 are proportional to absolute temperature, the ratio of current densities will remain constant with changes in temperature.

The emitter of the transistor 71, in addition to being connected to the base of the transistor 70, is connected to the collector and base of a transistor 76. A resistor 77 is connected from the emitter of the transistor 76 to the terminal 12. From the above description, particularly that pertaining to FIG. 3, it can be appreciated that if the collector current of the transistor 70 is proportional to absolute temperature, the difference of the emitter-base voltages of the transistors 70 and 76 which is impressed across the resistor 77 will also be proportional to absolute temperature. If the voltage across the resistor 77 is proportional to absolute temperature, the collector current of the transistor 76 is proportional to absolute temperature. Since the current into the bases of transistors 70 and 76 is negligible, the collector current of the transistor 71 is equal to the collector current of the transistor 76 and is, therefore, proportional to absolute temperature. The collector of the transistor 70 is connected through the resistor 75 to the emitter of a transistor 78 and is also connected to the base of the transistor 72. Since the current into the base of the transistor 72 is negligible, the collector current of the transistor 78 is equal to the collector current of the transistor 70. However, if the collector current of the transistor 78 attempts to increase, base drive will be supplied to the transistor 71 which will increase the base drive to the transistor 70, causing it to increase its conduction level, such that its collector current will remain equal to the collector current of the transistor 78. Accordingly, the transistors 70, 71 and 76 form a current inverter.

The base of the transistor 70 is connected to the base of a transistor 79 having its emitter connected through a resistor 80 to the terminal 12 and its collector connected to the emitter of the transistor 72. Accordingly, the difference of the emitterbase voltages of the transistors 70 and 79 is impressed across the resistor 80. If the collector current of the transistor 70 is proportional to absolute temperature, the collector current of the transistor 79 will also be proportional to absolute temperature. The collector current of the transistor 79 will also be proportional to absolute temperature. The collector current of the transistor 72 is equal to the collector current of the transistor 79, since the current into the base of the transistor 73 is negligible. Accordingly, it can be appreciated that the collector currents of the transistors 71 and 72 are proportional to absolute temperature. These collector currents are supplied from the collector of a transistor 81 which forms with transistors 82 and 83 a current inverter. The emitter of the transistor 81 is connected through a resistor 84 to a line 86. A resistor 87 is connected between the line 86 and the emitter of the transistor 82. The base and collector of the transistor 82 are connected to the base of the transistor 81 and to the emitter of the transistor 83. In addition, the collector of the transistor 81 is connected to the base of the transistor 83.

As previously mentioned, the collector current of the transistor 81 is proportional to absolute temperature, since the collector currents of the transistors 71 and 72 are proportional to absolute temperature. If the collector current of the transistor 81 tends to increase to a value greater than the sum of the collector currents of the transistors 71 and 72, the transistor 83 will be provided with base drive to change the base drive to the transistor 81. Accordingly, the transistor 83 maintains the collector current of the transistor 81 equal to the sum of the collector currents of the transistors 71 and 72. The resistors 84 and 87 are matched and, therefore, the collector current of the transistor 81 is equal to the collector current of the transistor 82. Disregarding the effects of a resistor 88 for the moment, which is connected between the emitter and the collector of the transistor 83, the collector current of the transistor 82 will be equal to the collector current of the transistor 83. Furthermore, the collector current of the transistor 83 will be equal to the collector current of the transistor 78. It can be appreciated, therefore, that the current inverter which includes the transistors 81, 82 and 83 forces the collector current of the transistor 70 to be equal to the collector current of the transistor 81. Since the collector current of the transistor 81 is proportional to absolute temperature, the collector current of the transistor 70 must also be proportional to absolute temperature.

In a constructed embodiment of the present invention, the collector current of the transistors 71, 72 76 and 79 were equal to fifty microamps and the collector currents of the transistors 70 and 73 were equal to one hundred microamps. The emitter areas of the transistors 72, 73, 76 and 79 were ten times the size of the emitter areas of the transistors 70 and 71. Accordingly, the collector current of the transistor 81 is evenly divided between the collector currents of the transistors 71 and 72. Both collector current differences and emitter area differences are, therefore, employed for operating the transistors at different current densities.

The collector of the transistor 73 is connected to the emitter of a transistor 89 having its collector connected through a resistor 91 to the terminal 10. The base of the transistor 89 is connected to the collector of the transistor 83. Accordingly, the transistors 73 and 89 are cascoded. Such cascoding eliminates the possibility of any change in the collector voltage affecting the collector current of the transistor 73.

The collector current of the transistor 73, being directly proportional to absolute temperature, results in a voltage drop across the resistor 91 which is also directly proportional to absolute temperature. This voltage drop is impressed upon one input of the differential amplifier 20. The resistor 75 compensates for minor variations in the current inverter output and the resistor 88 provides positive starting for the current inverter which includes the transistors 81, 82 and 83.

The transistor 78 biases transistor 89 at a voltage which is higher than the bias on the transistor 73. A transistor 92 has its emitter connected to the terminal 10 and its collector and base connected to the line 86. The line 86 is connected to the base of the transistor 61 in the regulator section 16 and to the base of a transistor 93. Since the collector currents of the transistors 81 and 82 are proportional to absolute temperature, the emitter-base voltage of the transistor 92 is also proportional to absolute temperature. Accordingly, the bias currents supplied to the transistors 61 and 93 are also proportional to absolute temperature. temperature. The emitter of the transistor 93 is connected through a resistor 94 to the terminal 10 and its collector is connected to the emitters of the transistors 97 and 98. Accordingly, the transistor 93 acts as a current source which varies with variations in temperature to supply the collector currents of the transistors 97 and 98.

Since it is easier in monolithic circuits to more closely match resistors, rather than transistors, the resistors 84 and 87, which are well matched to one another, are employed in the current inverter. Accordingly, the current conversion ratio is proportional to the resistor match and, therefore, the circuit is more easily implemented to provide output currents from the current inverter which are matched.

The differential amplifier 20 includes a pair of transistors 97 and 98 which form a differential stage. The transistors 97 and 98 are matched, such that when the emitter-base voltages thereof are equal, their collector currents will be equal. The collector of the transistor 97 is connected to one side of a current inverter which includes transistors 99, 100 and 101, and the collector of the transistor 98 is connected to the other side of the current inverter. More particularly, the collector of the transistor 98 is connected to the base of the transistor 99 and to the collector of the transistor 100, and the collector of the transistor 97 is connected to the collector of the transistor 101. The collector of the transistor 99 is connected to the terminal 10 and its emitter is connected to the bases of the transistors 100 and 101 and through a resistor 102 to the terminal 12. The emitters of the transistors 100 and 101 are connected together to the terminal 12.

If the input voltage supplied to the base of the transistor 97 is equal to the voltage impressed on the base of the transistor 98, the following conditions will exist in the current inverter. If the collector current of the transistor 98 is substantially greater than the collector current of the transistor 100, the transistor 99 will draw base current and conduct sufficiently to increase the conduction of the transistor 100. This action will continue until the collector current of the transistor 100 is substantially equal to the collector current of the transistor 98, with a relatively small and negligible current flow into the base of the transistor 99. Since the base-emitter voltage of the transistor 101 is equal to the base-emitter voltage of the transistor 100, the collector current of the transistor 101 will be equal to the collector current of the transistor 100. The collector of the transistor 101 is connected to the base of a transistor 103. If the base drive to the transistors 97 and 98 are equal, the collector current of the transistor 97 will be equal to the collector current of the transistor 98 and, therefore, equal to the collector current of the transistor 101. Accordingly, no base current will be supplied to the base of the transistor 103 and it will, therefore, be nonconductive.

If the voltage supplied to the base of the transistor 97 is different from the voltage supplied to the base of the transistor 98, the following conditions will exist. The collector current of the transistor 98 will remain equal to the collector current of the transistor 100 which, in turn, will remain equal to the collector current of the transistor 101. However, with a different base drive to the transistors 97 and 98, the collector currents of the transistors 97 and 98 will be different. The amount of the difference between the collector currents of the transistors 97 and 98 will be equal to the amount of difference between the collector currents of the transistors 97 and 101. This difference, therefore, will be supplied to the base of the transistor 103. The collector of the transistor 103 is connected to the terminal 10 and its emitter is connected to the base of a transistor 104 which corresponds to the transistor 24 illustrated in FIG. 1. The input to the base of the transistor 103 is multiplied by its beta and supplied to the base of the transistor 104 which, in turn, developes an output as explained hereinabove. This arrangement provides a relatively high gain, and in a constructed embodiment of the present invention a gain of 80,000 resulted.

By connecting the terminal 14 to the terminal 22, the differential amplifier 20 becomes an operational amplifier by virtue of the feedback from its output to one of its inputs. A resistor 105 is connected between the terminal 22 and the base of the transistor 98 and a resistor 106 and capacitor 107 are connected in series between the terminal 22 and the collector of the transistor 97. These components provide frequency compensation, so that the circuit will not oscillate when feedback is supplied thereto.

A transistor 108 has its base connected to one emitter of the transistor 104, its collector connected to the base of the transistor 103, and its emitter connected to the terminal 12. A resistor 109 is connected from the emitter of the transistors 103 to the base of the transistor 108 and a resistor 110 is connected from the one emitter meitte of the transistor 104 to the terminal 12. The transistor 108 senses the output current and provides current limiting for the circuit. That is, the voltage on the resistor 110 is impressed across the base-emitter junction of the transistor 108, and when the voltage exceeds a predetermined amount, the transistor 108 is rendered conductive. When the transistor 108 is conducting, current is drawn therethrough and away from the base of the transistor 103, such that a relatively large load on the output, such as a short circuit, will not destroy the circuit. The resistor 109 establishes a minimum operating current for the transistor 103 and eliminates the possibility of leakage across the transistor 104. The resistor 28 is an internal pull-up load and a transistor 111 is employed as a disconnected diode, such that the terminal 14 can be operated at a potential which is more positive than the potential supplied to the terminal 10. The transistor 111 corresponds to the diode 26 illustrated in FIG. 1.

The second emitter of the transistor 104, which is connected to the collector of the transistor 108, forms a saturation clamp. When the transistor 103 begins to conduct, the transistor 104 saturates. The current through the transistor 104 is limited by the external load resistance and the resistance of the resistor 110. However, the operating current of the transistor 103 will be excessive under such conditions. When the transistor 104 saturates, its collector reinjects holes into its base. These holes are collected by the second emitter which effectively becomes a collector of the transistor 104. Accordingly, the second emitter, acting as a collector, draws current away from the base of the transistor 103 to limit saturation of the transistor 104. In a constructed embodiment of the present invention, the following values of the indicated components were employed successfully:

| | |
|---|---|
| Resistor 76 | 260 ohms |
| Resistor 74 | 940 ohms |
| Resistors 77 and 80 | 1.56K ohms |
| Resistors 67, 105 and 106 | 3K ohms |
| Resistor 65 | 4.5K ohms |
| Resistors 84 and 87 | 5K ohms |
| Resistor 94 | 6K ohms |
| Resistors 58, 91 and 110 | 30K ohms |
| Resistors 102 and 109 | 40K ohms |
| Resistor 28 | 50K ohms |
| Resistor 56 | 100K ohms |
| Resistor 88 | 300K ohms |
| Capacitor 68 | 10 pf |
| Capacitors 66 and 107 | 30 pf |

The invention claimed is:

1. A temperature sensor, comprising:
a first transistor having a first parameter thereof which is proportional to temperature and to a second parameter thereof,
a second transistor having a first parameter thereof which is proportional to temperature and to a second parameter thereof,
means for maintaining the ratio of the value of said second parameter of said first transistor to the value of said second parameter of said second transistor constant with changes in temperature and at a value different than one, and
means for sensing the difference between the values of said first parameters.

2. The temperature sensor of claim 1, further comprising means for scaling an output of said sensing means to provide an output which is directly proportional to temperature in degrees Kelvin.

3. The temperature sensor of claim 1, wherein said first transistor and said second transistor each have a temperature coefficient which is proportional to temperature, said maintaining means being disposed for maintaining the ratio of the current density of said first transistor to the current density of said second transistor constant with changes in temperature, and said sensing means being disposed for sensing the difference between the emitter-base voltage of said first transistor and the emitter-base voltage of said second transistor.

4. The temperature sensor of claim 1, further comprising a third transistor and a fourth transistor each having a first parameter thereof which is proportional to temperature and to a second parameter thereof, said maintaining means being disposed for maintaining the ratio of the sum of the values of said second parameters of said first and third transistors to the sum of the values of said second parameters of said second and fourth transistors constant with changes in temperature, and wherein said sensing means is disposed for sensing the difference between the sum of the values of said first parameters of said first and third transistors and the sum of the values of said first parameters of said second and fourth transistors.

5. The temperature sensor of claim 4, wherein said first parameters are the emitter-base voltages of said transistors and said second parameters are the current densities of said transistors.

6. The temperature sensor of claim 5, wherein said current densities are equal to the product of the collector current and the reciprocal of the emitter area of each of said transistors.

7. The temperature sensor of claim 4, wherein said maintaining means include a fifth transistor having its base connected to the base of said first transistor, and a first impedance element connected between the emitters of said first and fifth transistors.

8. The temperature sensor of claim 7, therein the collector of said fifth transistor is connected in series with the emitter of said third transistor.

9. The temperature sensor of claim 8, further comprising a current inverter having a first output connected in series with the collector of said first transistor and having a second output connected in series with the collector of said third transistor.

10. The temperature sensor of claim 9, further comprising a sixth transistor having its base connected to the base of said first transistor, and a second impedance element connected between the emitters of said first transistor and said sixth transistor, the collector of said sixth transistor being connected to the emitter of said fourth transistor, and the collector of said fourth transistor being connected in series with said second output of said current inverter.

11. The temperature sensor of claim 1, further comprising a pair of terminals disposed for connection to respective sides of a voltage source and connected to said first and second transistors, and a voltage regulator connected between said terminals and including a Zener diode, a first impedance element connected in series with said Zener diode between said terminals, and means connected across said terminals and disposed for conducting current there through in proportion to the current flow through said Zener diode.

12. The temperature sensor of claim 11, wherein said conducting means includes a third transistor having its base connected to the junction of said Zener diode and said first impedance element, and its collector and emitter connected to a respective one of said terminals.

13. The temperature sensor of claim 12, wherein said conducting means further includes a second impedance element connected in series with the emitter and collector of said third transistor, and a fourth transistor having its base connected to the junction of said third transistor and said second impedance element and its collector and emitter connected to a respective one of said terminals.

14. The temperature sensor of claim 13, wherein said conducting means further includes a third impedance element connected in series with the emitter and collector of said fourth transistor, and a fifth transistor having its base connected to the junction of said fourth transistor and said third impedance element and its emitter and collector connected to a respective one of said terminals.

15. The temperature sensor of claim 14, wherein said second and third impedance elements include a sixth and seventh transistor, respectively, said sixth transistor including a first collector-emitter circuit connected in series with the collector of said third transistor and a second collector-emitter circuit connected to the base of said seventh transistor.

16. The temperature sensor of claim 15, wherein said seventh transistor includes a first collector-emitter circuit connected in series with the collector of said fourth transistor and a second collector-emitter circuit connected in series with said Zener diode.

17. The temperature sensor of claim 11, further comprising a differential amplifier connected to an output of said sensing means.

18. The temperature sensor of claim 17, wherein said differential amplifier includes a differential stage having one input thereof connected to the output of said sensing means, a third transistor connected to an output of said differential stage, a fourth transistor cascaded with said third transistor, and a fifth transistor having its collector-emitter circuit connected to the base of said third transistor and its base connected to a first collector-emitter circuit of said fourth transistor.

19. The temperature sensor of claim 18, wherein said fourth transistor includes a second collector-emitter circuit connected to the base of said third transistor.

20. The temperature sensor of claim 17, wherein said differential amplifier includes a differential stage having one input thereof connected to the output of said sensing means, a third transistor connected to an output of said differential stage, a fourth transistor cascaded with said third transistor and having a first collector-emitter circuit thereof disposed for connection to an output, a second collector-emitter circuit of said fourth transistor being connected to the base of said third transistor.

21. The temperature sensor of claim 1, wherein the bases of said transistors are connected together, and wherein said sensing means includes an impedance element connected between the emitters of said transistors, and said maintaining means includes a current source connected to the collector of one of said transistors and having an output which is proportional to temperature.

22. A temperature transducer, comprising:
a first pair of terminals disposed for connection to a power source,
a voltage regulator connected between said pair of terminals,
a temperature sensor having an output connected between said pair of terminals,
a second pair of terminals, the first one forming an input terminal and a second one forming an output terminal; and
a differential amplifier having a first input connected to an output of said sensor and a second input connected to said first one of said second pair of terminals and an output connected to said second one of said second pair of terminals.

23. The temperature transducer of claim 22, wherein said temperature sensor develops an output which is directly proportional to temperature.

* * * * *